(12) United States Patent
Suzuki et al.

(10) Patent No.: US 12,509,347 B2
(45) Date of Patent: Dec. 30, 2025

(54) MIRROR DEVICE MANUFACTURING METHOD AND MIRROR UNIT MANUFACTURING METHOD

(71) Applicant: HAMAMATSU PHOTONICS K.K., Hamamatsu (JP)

(72) Inventors: Daiki Suzuki, Hamamatsu (JP); Tomoyuki Ide, Hamamatsu (JP); Mikito Takahashi, Hamamatsu (JP)

(73) Assignee: HAMAMATSU PHOTONICS K.K., Hamamatsu (JP)

( * ) Notice: Subject to any disclaimer, the term of this patent is extended or adjusted under 35 U.S.C. 154(b) by 7 days.

(21) Appl. No.: 17/765,633

(22) PCT Filed: Aug. 27, 2020

(86) PCT No.: PCT/JP2020/032444
§ 371 (c)(1),
(2) Date: Mar. 31, 2022

(87) PCT Pub. No.: WO2021/070503
PCT Pub. Date: Apr. 15, 2021

(65) Prior Publication Data
US 2022/0363535 A1 Nov. 17, 2022

(30) Foreign Application Priority Data
Oct. 11, 2019 (JP) .................. 2019-187452

(51) Int. Cl.
*B81C 1/00* (2006.01)
*B08B 1/16* (2024.01)
(Continued)

(52) U.S. Cl.
CPC ............ *B81C 1/00857* (2013.01); *B08B 6/00* (2013.01); *B08B 7/0028* (2013.01); *B08B 11/00* (2013.01);
(Continued)

(58) Field of Classification Search
CPC ......... B08B 1/165; B08B 6/00; B08B 7/0028; B08B 11/00; G02B 26/0833–0841;
(Continued)

(56) References Cited

U.S. PATENT DOCUMENTS 5,634,230 A * 6/1997 Maurer .................. G03F 1/82
15/312.1
7,796,315 B1 9/2010 Fu
(Continued)

FOREIGN PATENT DOCUMENTS

CN 109154712 A 1/2019
JP S61-034172 2/1986
(Continued)

OTHER PUBLICATIONS

Translation of JP2011203561 (Year: 2011).*
(Continued)

*Primary Examiner* — Matthew P Travers
(74) *Attorney, Agent, or Firm* — Faegre Drinker Biddle & Reath LLP

(57) ABSTRACT

A mirror device manufacturing method includes a forming step of forming a structure by forming a base portion, a movable portion, and a coupling portion coupling the base portion and the movable portion to each other such that the movable portion is able to swing with respect to the base portion through processing of a wafer, and forming a mirror layer in the movable portion; and a collecting step of performing collection of foreign substances from the structure using a collection member after the forming step. A mirror unit manufacturing method includes a sealing step of sealing the mirror device after the collecting step.

10 Claims, 12 Drawing Sheets

(51) Int. Cl.
- *B08B 6/00* (2006.01)
- *B08B 7/00* (2006.01)
- *B08B 11/00* (2006.01)
- *B81B 3/00* (2006.01)
- *B81C 3/00* (2006.01)
- *G02B 26/08* (2006.01)
- *G02B 27/00* (2006.01)
- *H01L 21/02* (2006.01)

(52) U.S. Cl.
CPC ........ *B81B 3/0062* (2013.01); *B81C 1/00174* (2013.01); *B81C 1/00198* (2013.01); *B81C 1/00849* (2013.01); *G02B 26/0833* (2013.01); *G02B 27/0006* (2013.01); *H01L 21/02057* (2013.01); *H01L 21/02096* (2013.01); *B08B 1/165* (2024.01); *B81C 3/00* (2013.01)

(58) Field of Classification Search
CPC ..... G02B 27/0006; B81B 3/00; B81B 3/0062; B81B 2201/042; B81C 1/0019; B81C 1/00198; B81C 1/00317; B81C 1/00841–00857; B81C 3/00; H01L 21/02057–0206; H01L 21/02076; H01L 21/02096; B25J 7/00; B25J 15/008–0085
See application file for complete search history.

(56) References Cited

U.S. PATENT DOCUMENTS

| | | | |
|---|---|---|---|
| 8,041,208 B2 | 10/2011 | Seita | |
| 2005/0274898 A1 | 12/2005 | Watanabe et al. | |
| 2016/0216290 A1 | 7/2016 | Tang et al. | |
| 2016/0263632 A1* | 9/2016 | Robinson | G03F 1/82 |
| 2019/0293923 A1* | 9/2019 | Ghahremani | B81B 7/0067 |
| 2020/0310112 A1* | 10/2020 | Hirose | G01N 21/15 |

FOREIGN PATENT DOCUMENTS

| | | |
|---|---|---|
| JP | H6132584 A | 5/1994 |
| JP | H7-156082 A | 6/1995 |
| JP | H08-097179 A | 4/1996 |
| JP | 2004333887 A | 11/2004 |
| JP | 2006-032940 A | 2/2006 |
| JP | 2006-334697 A | 12/2006 |
| JP | 2007-034309 A | 2/2007 |
| JP | 2009175463 A | 8/2009 |
| JP | 2010002777 A | 1/2010 |
| JP | 2010-181339 A | 8/2010 |
| JP | 2011-112806 A | 6/2011 |
| JP | 2011-203561 A | 10/2011 |
| JP | 2015-010116 A | 1/2015 |
| JP | 2015-216234 A | 12/2015 |
| JP | 2019-095670 A | 6/2019 |
| KR | 101745441 B1 | 6/2017 |
| WO | 2007/125756 A1 | 11/2007 |

OTHER PUBLICATIONS

Translation of JPH07156082A (Year: 1995).*
International Preliminary Report on Patentability mailed Apr. 21, 2022 for PCT/JP2020/032444.

* cited by examiner

Fig.6
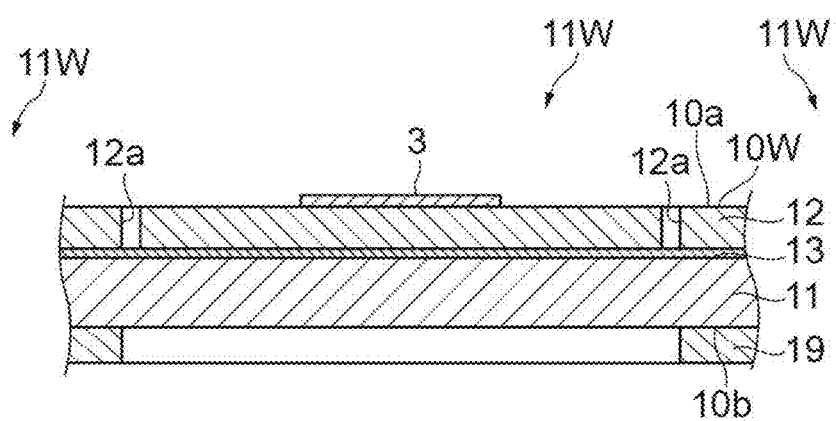
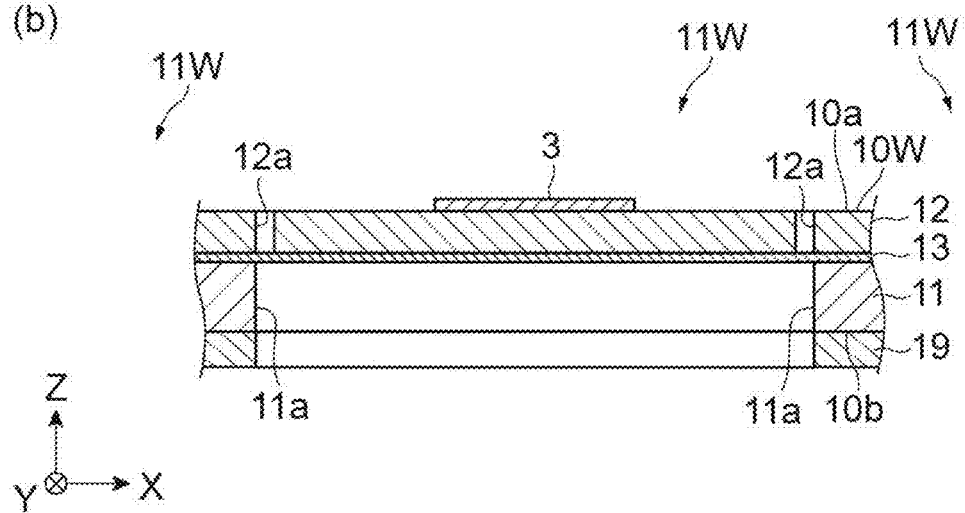

Fig.8
(a)
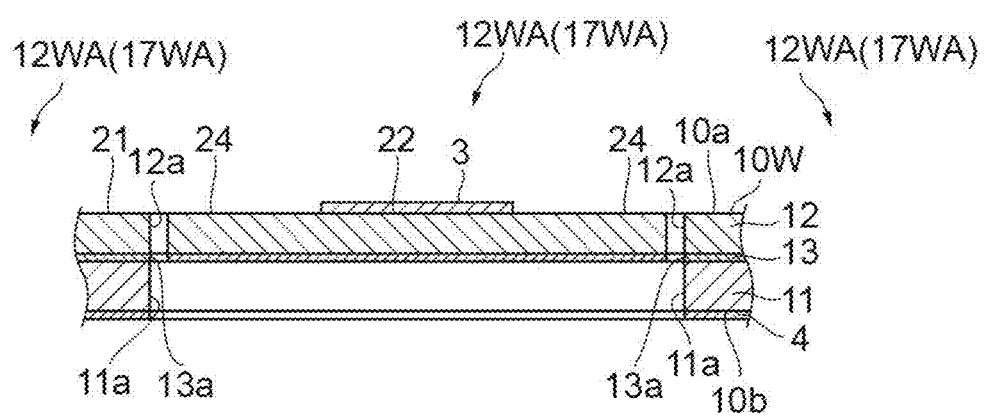
(b)
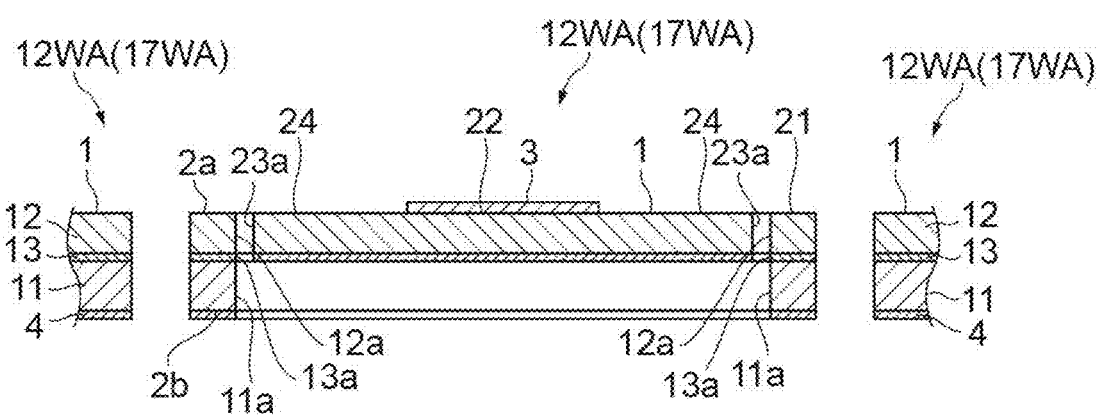
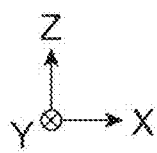

*Fig.*9
(a)
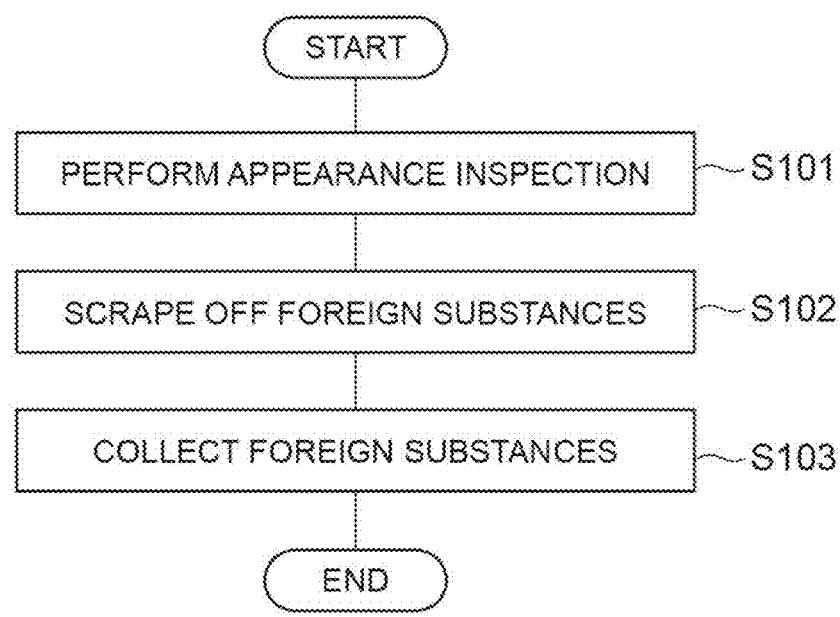
(b)
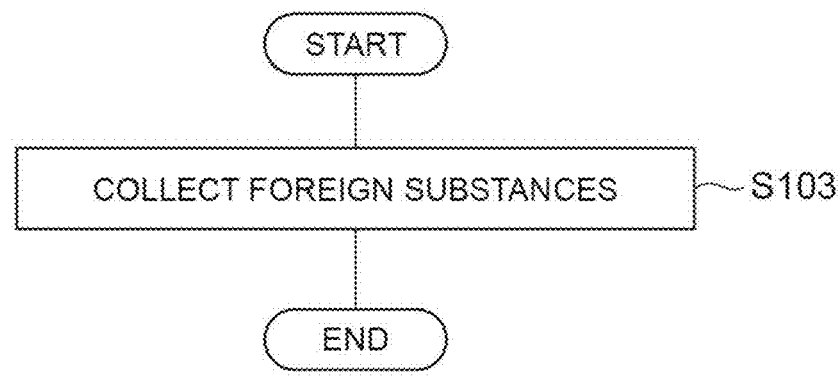

Fig.10
(a)
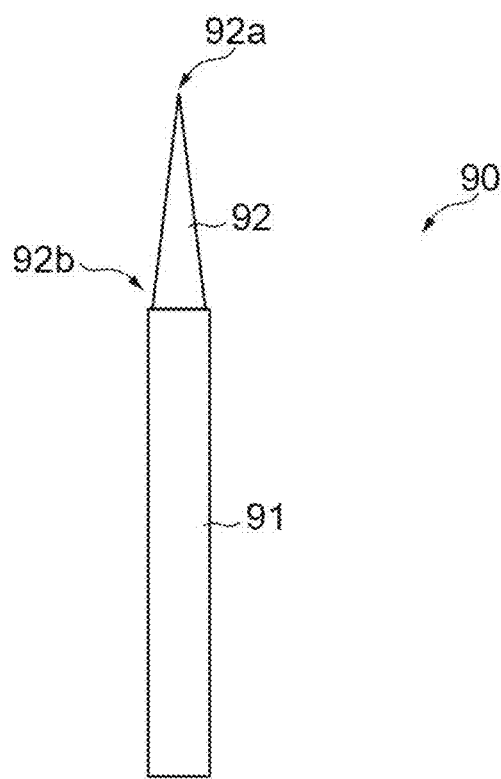
(b)
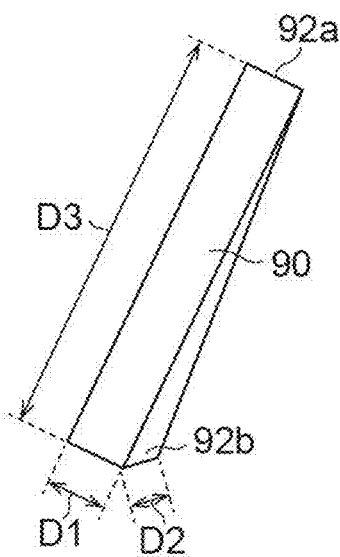

MIRROR DEVICE MANUFACTURING METHOD AND MIRROR UNIT MANUFACTURING METHOD

TECHNICAL FIELD

The present disclosure relates to a mirror device manufacturing method and a mirror unit manufacturing method.

BACKGROUND ART

Regarding a micro-electro mechanical system (MEMS) device constituted of a silicon-on-insulator (SOI) substrate, a mirror unit comprising a structure including a base portion and a movable portion supported on the base portion, and a mirror layer provided in the movable portion is known. Regarding a method for manufacturing such a mirror unit, after a plurality of parts individually corresponding to the structure are formed on a wafer, the wafer may be cleaned using a cleaning liquid (for example, refer to Patent Literature 1).

CITATION LIST

Patent Literature

[Patent Literature 1] Japanese Unexamined Patent Publication No. 2006-334697

SUMMARY OF INVENTION

Technical Problem

Incidentally, in a mirror unit as described above, it is desirable to curb deterioration in reflectance caused by foreign substances adhered to a mirror layer. In this regard, for example, a method of removing foreign substances adhered to the mirror layer by air-blowing with respect to the mirror layer is conceivable. However, if the foreign substances are scattered by air-blowing, there is concern that scattered foreign substances may enter a part under a movable portion and affect operation of the movable portion. Therefore, it is desirable to remove foreign substances by a different method.

An object of the present disclosure is to provide a mirror device manufacturing method and a mirror unit manufacturing method in which influence on operation of a movable portion is curbed and foreign substances can be removed.

Solution to Problem

A mirror device manufacturing method according to the present disclosure includes a forming step of forming a structure by forming a base portion, a movable portion, and a coupling portion coupling the base portion and the movable portion to each other such that the movable portion is able to swing with respect to the base portion through processing of a wafer, and forming a mirror layer in the movable portion; and a collecting step of performing collection of foreign substances from the structure using a collection member after the forming step.

In this manufacturing method, first, a structure is formed by forming the swingable movable portion and forming the mirror layer in the movable portion. Further, the collection of foreign substances from the structure is performed using the collection member. For this reason, when foreign substances are adhered to the structure, the foreign substances are removed. Particularly, in this manufacturing method, since foreign substances of the structure are collected, scattered foreign substances do not affect operation of the movable portion. That is, according to this manufacturing method, influence on operation of the movable portion is curbed, and foreign substances can be removed.

In the mirror device manufacturing method according to the present disclosure, in the collecting step, the collection of foreign substances may be performed by bringing the collection member into contact with only the foreign substances. In this case, the collection member does not directly come into contact with the structure. Therefore, damage to a surface of the structure is avoided.

The mirror device manufacturing method according to the present disclosure may further include a first inspecting step of performing appearance inspection of the structure after the forming step, and before the collecting step, or during the collecting step. In this case, foreign substances on the structure can be found and reliably collected through the appearance inspection.

In the mirror device manufacturing method according to the present disclosure, in the collecting step, the collection of foreign substances may be performed with respect to a region where the foreign substances are present in the structure when the foreign substances are found on the structure as a result of the first inspecting step. In this case, foreign substances found through the appearance inspection can be more reliably collected.

The mirror device manufacturing method according to the present disclosure may further include a first scraping step of scraping off the foreign substances after the first inspecting step, and before the collecting step, or during the collecting step when the foreign substances are found on the structure as a result of the first inspecting step. In this case, even when foreign substances are firmly adhered to the structure, the foreign substances can be reliably collected.

The mirror device manufacturing method according to the present disclosure may further include a second inspecting step of performing appearance inspection of the structure after the collecting step, and a second scraping step of scraping off the foreign substances when the foreign substances remain in the structure as a result of the second inspecting step. The collecting step may be performed again after the second scraping step. In this case, foreign substances which could not be collected in the collecting step can be reliably collected.

In the mirror device manufacturing method according to the present disclosure, in the collecting step, the collection of foreign substances may be performed by bringing the collection member into contact with the entire surface of the structure. In this case, since there is no need to identify the presence or absence of foreign substances on the structure and positions of foreign substances, the appearance inspection can be omitted.

In the mirror device manufacturing method according to the present disclosure, in the collecting step, the collection of foreign substances may be performed by bringing the collection member into contact with a part of the structure. In this case, areas in the structure with which the collection member comes into contact are limited. Therefore, a range in the structure having a possibility of damage can be limited. In this case as well, the appearance inspection can be omitted by setting parts with which the collection member is brought into contact in advance.

In the mirror device manufacturing method according to the present disclosure, in the collecting step, the collection of foreign substances may be performed using the collection member having a rigidity lower than a rigidity of the movable portion. In this case, the collection member is preferentially bent with respect to the movable portion. Therefore, bending of the movable portion can be curbed.

In the mirror device manufacturing method according to the present disclosure, in the collecting step, the collection of foreign substances may be performed by bringing the collection member into contact with the movable portion such that the movable portion is not bent. In this case, breakage of the movable portion can be curbed.

In the mirror device manufacturing method according to the present disclosure, the movable portion may be able to swing about a swinging axis that is an axis passing through the coupling portion. In the collecting step, the collection of foreign substances may be performed by bringing the collection member into contact with the movable portion such that a torque generated in the coupling portion in accordance with a force applied from the collection member to the movable portion becomes equal to or smaller than a torque causing a swinging angle of the movable portion to be the largest. In this case, breakage of the coupling portion providing a rotary axis of the movable portion can be curbed.

The mirror device manufacturing method according to the present disclosure may further include a cutting step of cutting the wafer. In the forming step, a plurality of parts each corresponding to the structure may be formed in the wafer. In the cutting step, the wafer may be cut such that each of the plurality of parts is cut out from the wafer after the collecting step. In this case, a plurality of mirror devices can be manufactured. Particularly, in this case, since the collection of foreign substances is performed before the wafer is cut, influence on operation of the movable portion due to movement of foreign substances on the structure when the wafer is cut is avoided. In addition, before the cutting step, since parts corresponding to a plurality of structures adjacent to each other are integrated, the structures are in a high strength state. For this reason, breakage is unlikely to occur in the structure during the collecting step.

The mirror device manufacturing method according to the present disclosure may further include a cutting step of cutting the wafer. In the forming step, a plurality of parts each corresponding to the structure may be formed in the wafer. In the cutting step, the wafer may be cut such that each of the plurality of parts is cut out from the wafer after the forming step and before the collecting step. In this case, a plurality of mirror devices can be manufactured. Particularly, in this case, since the collection of foreign substances is performed after the wafer is cut, foreign substances which have been generated and adhered when the wafer is cut can be removed.

A mirror unit manufacturing method according to the present disclosure includes a preparing step of preparing a mirror device having a structure including a base portion, a movable portion, a coupling portion coupling the base portion and the movable portion to each other such that the movable portion is able to swing with respect to the base portion, and a mirror layer provided in the movable portion, and a mounting member for mounting the mirror device; a mounting step of mounting the mirror device after the preparing step; and a collecting step of performing collection of foreign substances from the structure using a collection member after the mounting step.

In this manufacturing method, first, the mirror device having a structure including the swingable movable portion provided with the mirror layer is prepared. Further, after the mirror device is fixed to a mounting portion, the collection of foreign substances from the structure is performed using the collection member. For this reason, when foreign substances are adhered to the structure, the foreign substances are removed. Particularly, in this manufacturing method, since foreign substances of the structure are collected, scattered foreign substances do not affect operation of the movable portion. That is, according to this manufacturing method, influence on operation of the movable portion is curbed, and foreign substances can be removed. In addition, in this manufacturing method, the collection of foreign substances is performed after the mirror device is fixed to the mounting portion. Namely, in this manufacturing method, the collection of foreign substances is performed in a latter step. Therefore, a risk that foreign substances are adhered again in a step after the collection of foreign substances is performed becomes small.

The mirror unit manufacturing method according to the present disclosure may further include a sealing step of sealing the mirror device after the collecting step. In this case, since the collection of foreign substances is performed before the mirror device is sealed, a yield rate is improved.

Advantageous Effects of Invention

According to the present disclosure, it is possible to provide a mirror device manufacturing method and a mirror unit manufacturing method in which influence on operation of a movable portion is curbed and foreign substances can be removed.

BRIEF DESCRIPTION OF DRAWINGS

FIG. 6 is a cross-sectional view for describing the mirror device manufacturing method illustrated in FIG. 2.

FIG. 8 is a cross-sectional view for describing the mirror device manufacturing method illustrated in FIG. 2.

FIG. 9 is a flowchart of a step of removing foreign substances shown in FIG. 4.

FIG. 10 is a view illustrating an example of a collection member.

DESCRIPTION OF EMBODIMENT

Hereinafter, an embodiment of the present disclosure will be described in detail with reference to the drawings. In the respective diagrams, the same elements or corresponding elements are designated by the same reference signs, and duplicate description thereof may be omitted.

Figure 1:
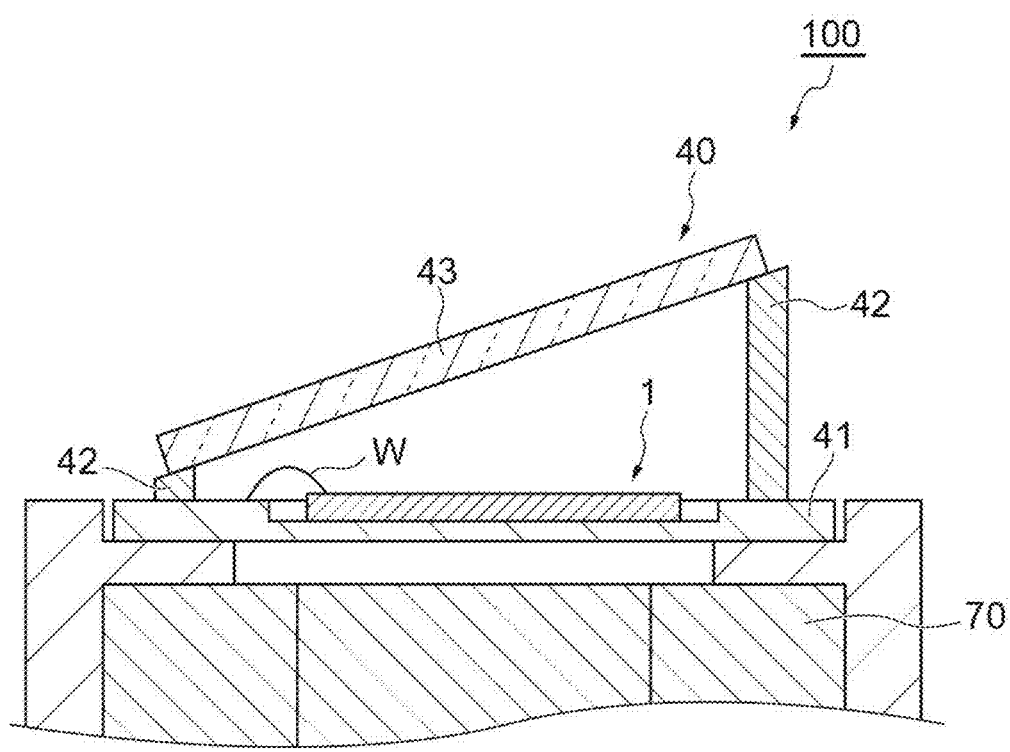
FIG. 1 is a schematic cross-sectional view illustrating a mirror unit according to an embodiment.

FIG. 1 is a schematic cross-sectional view illustrating a mirror unit according to the embodiment. As illustrated in FIG. 1, a mirror unit 100 includes a mirror device 1, a package 40, and a magnetic field generation portion 70 generating a magnetic field acting on the mirror device 1. The package 40 includes a mounting substrate 41, a frame member 42, and a window member 43. The mirror device 1 is mounted on the mounting substrate 41 and is electrically connected to the mounting substrate 41 side through a wire W.

The frame member 42 stands upright on a mounting surface such that the mirror device 1 is surrounded when viewed in a direction intersecting the mounting surface of the mirror device 1 in the mounting substrate 41. For example, the window member 43 is formed to have a plate shape using a light-transmitting material such as a glass and is joined to an end portion in the frame member 42 on a side opposite to the mounting substrate 41. Accordingly, the mirror device 1 is sealed by the package 40. As an example, the mirror unit 100 is an optical scanning device used in an optical switch for optical communication, an optical scanner, and the like.

Figure 2:
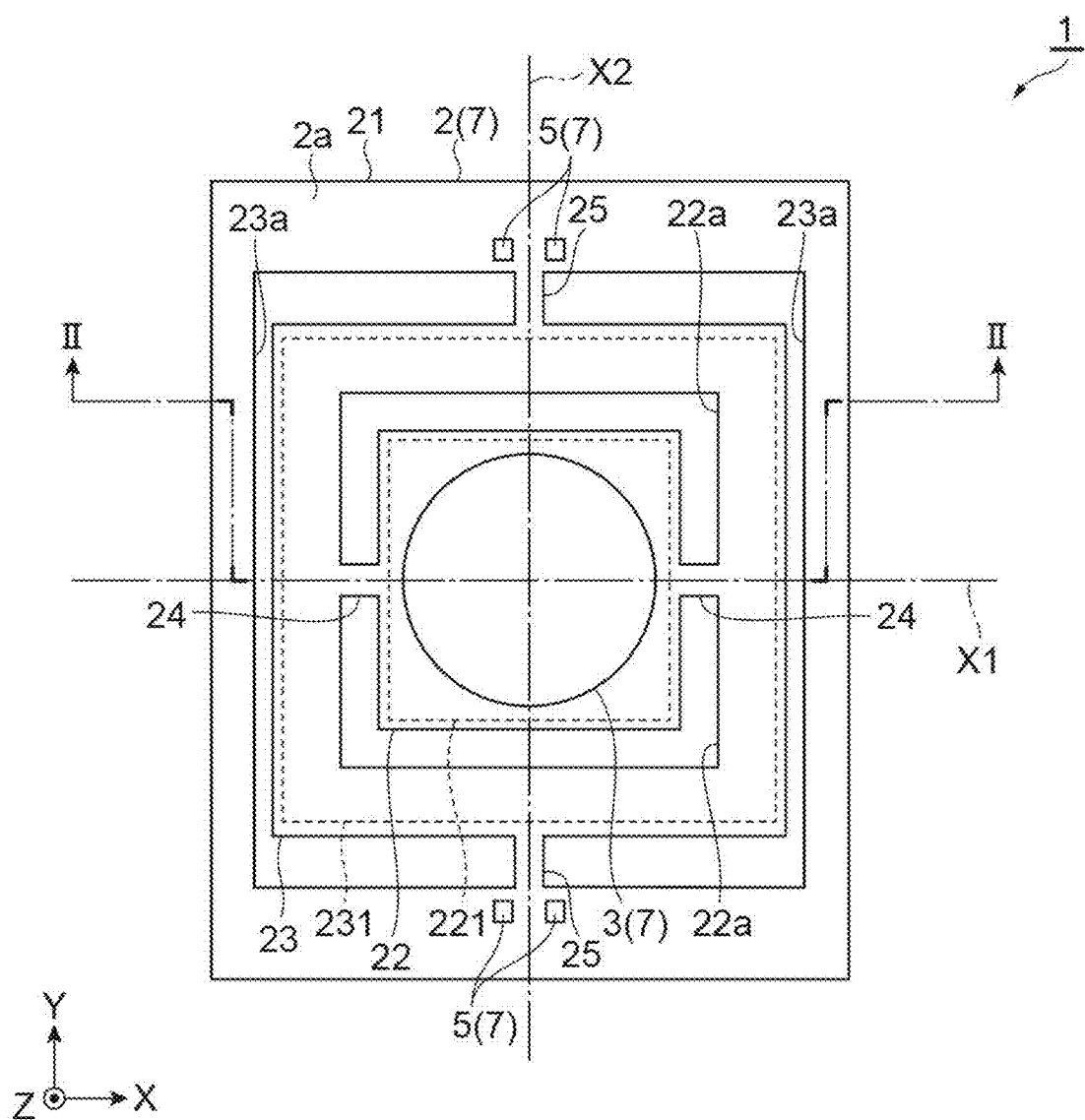
FIG. 2 is a plan view illustrating a mirror device according to the present embodiment.
Figure 3:
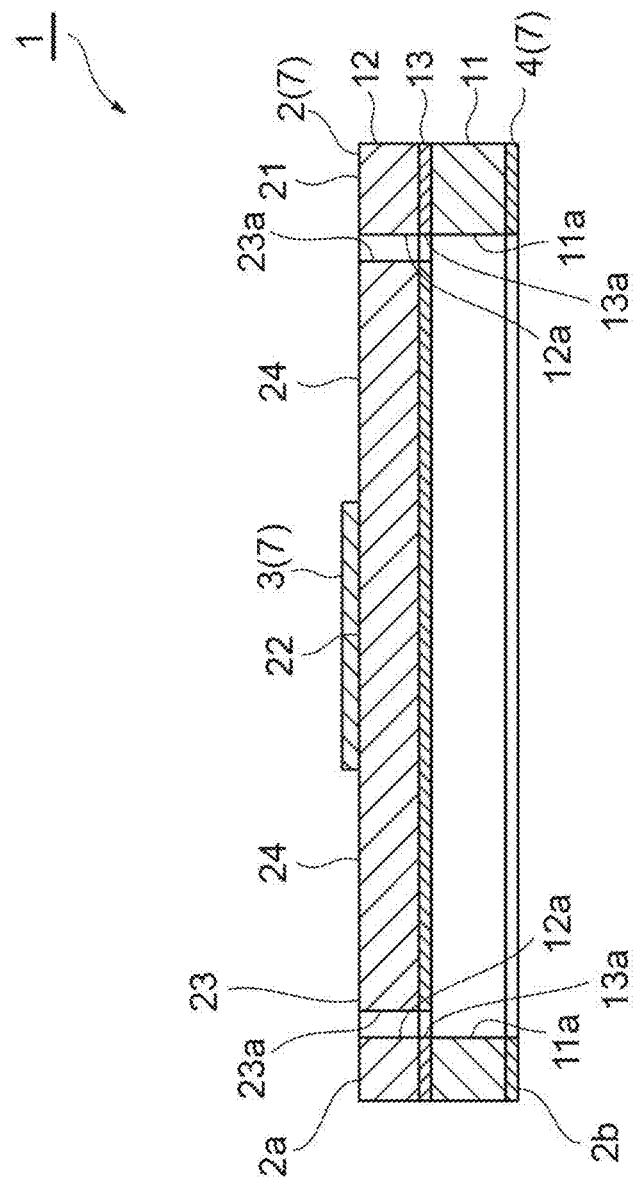
FIG. 3 is a cross-sectional view of the mirror device illustrated in FIG. 2 along line II-II.

FIG. 2 is a plan view illustrating the mirror device according to the present embodiment. FIG. 3 is a cross-sectional view of the mirror device illustrated in FIG. 2 along line II-II. In the following diagrams, an orthogonal coordinate system defined by an X axis, a Y axis, and a Z axis may be illustrated. As illustrated in FIGS. 2 and 3, the mirror device 1 includes a structure 2, a mirror layer 3, and a straightening layer 4. The mirror device 1 exhibits a line-symmetrical shape with respect to each of a first axis X1 along an X axis direction and a second axis X2 along a Y axis direction. However, the shape of the mirror device 1 may be point-symmetrical with respect to a center point of the mirror layer 3 (for example, an intersection between the first axis X1 and the second axis X2) or may be non-symmetrical instead of being line-symmetrical or point-symmetrical. The mirror device 1 is a micro-electro mechanical system (MEMS) device (for example, an MEMS mirror).

For example, the structure 2 is constituted of an SOI substrate. The structure 2 has a support layer 11, a device layer 12, and an intermediate layer 13. For example, the support layer 11 is a first silicon layer of the SOI substrate. For example, the device layer 12 is a second silicon layer of the SOI substrate. The intermediate layer 13 is an insulation layer disposed between the support layer 11 and the device layer 12. As an example, the thickness of the support layer 11 is approximately 100μ to 700 μm, the thickness of the device layer 12 is approximately 20 μm to 200 μm, and the thickness of the intermediate layer 13 is approximately 50 μm to 3,000 μm.

For example, the structure 2 exhibits a rectangular plate shape. The structure 2 has a first front surface 2a and a second front surface 2b. The first front surface 2a is a surface on a side opposite to the intermediate layer 13 in the device layer 12. The second front surface 2b is a surface on a side opposite to the first front surface 2a in the structure 2. The second front surface 2b includes a surface on a side opposite to the intermediate layer 13 in the support layer 11 and a surface on a side opposite to the first front surface 2a in the device layer 12.

The structure 2 is integrally constituted of a base portion 21, a first movable portion 22, a second movable portion 23, a pair of first coupling portions 24, and a pair of second coupling portions 25. The base portion 21 is constituted of a part of the support layer 11, a part of the device layer 12, and a part of the intermediate layer 13. The base portion 21 exhibits a rectangular ring shape when viewed in a Z axis direction (a thickness direction of the structure 2). The base portion 21 has a size of approximately 10 mm×15 mm, for example, when viewed in the Z axis direction.

The first movable portion 22, the second movable portion 23, the first coupling portions 24, and the second coupling portions 25 are constituted of a part of the device layer 12. The first movable portion 22 and the second movable portion 23 are supported on the base portion 21. Specifically, the first movable portion 22 and the second movable portion 23 are disposed on an inward side of the base portion 21 when viewed in the Z axis direction. More specifically, the second movable portion 23 is disposed on the inward side of the base portion 21 via a second slit 23a penetrating the structure 2 when viewed in the Z axis direction. The second movable portion 23 exhibits a rectangular ring shape, for example, when viewed in the Z axis direction. The second slit 23a extends along an outer edge of the second movable portion 23 when viewed in the Z axis direction. Through the second slit 23a, each of an end surface 11a of the support layer 11 in the base portion 21, an end surface 12a of the device layer 12 in the base portion 21, and an end surface 13a of the intermediate layer 13 in the base portion 21 is exposed.

The second coupling portions 25 are respectively disposed on both sides of the second movable portion 23 in the Y axis direction when viewed in the Z axis direction. For example, each of the second coupling portions 25 linearly extends along the Y axis direction. Each of the second coupling portions 25 couples the second movable portion 23 and the base portion 21 to each other on the second axis X2 such that the second movable portion 23 can swing around the second axis X2. The second slit 23a includes parts extending along the Y axis direction on both sides of each of the second coupling portions 25 in the X axis direction. Namely, each of the second coupling portions 25 is disposed on the inward side of the base portion 21 via the second slit 23a.

When viewed in the Z axis direction, the first movable portion 22 is disposed on the inward side of the second movable portion 23 via a first slit 22a penetrating the structure 2. The first movable portion 22 exhibits a rectangular shape, for example, when viewed in the Z axis direction. The first slit 22a extends along an outer edge of the first movable portion 22 when viewed in the Z axis direction.

The first coupling portions 24 are respectively disposed on both sides of the first movable portion 22 in the X axis direction when viewed in the Z axis direction. For example, each of the first coupling portions 24 linearly extends along the X axis direction. Each of the first coupling portions 24 couples the first movable portion 22 and the second movable portion 23 to each other on the first axis X1 such that the first movable portion 22 can swing around the first axis X1 along the X axis direction.

The mirror layer 3 is provided in the first movable portion 22. Specifically, the mirror layer 3 is provided in a region corresponding to the first movable portion 22 on the first front surface 2a of the structure 2. The mirror layer 3 exhibits a circular shape, for example, when viewed in the Z axis direction. The mirror layer 3 is disposed with the intersection between the first axis X1 and the second axis X2 as a center position (centroid position). For example, the mirror layer 3 is constituted of a reflection film formed of aluminum, an aluminum-based alloy, silver, a silver-based alloy, gold, a dielectric multi-layer, or the like.

The straightening layer 4 is formed on the entire second front surface 2b. Specifically, in the base portion 21, the straightening layer 4 is formed on a surface on a side opposite to the intermediate layer 13 in the support layer 11. In the first movable portion 22, the second movable portion 23, each of the first coupling portions 24, and each of the second coupling portions 25, the straightening layer 4 is formed on a surface on a side opposite to the mirror layer 3 in the device layer 12. The straightening layer 4 straightens warpage or the like of the first movable portion 22, the second movable portion 23, each of the first coupling portions 24, and each of the second coupling portions 25. For example, the straightening layer 4 is constituted using an inorganic film such as silicon oxide or silicon nitride, a metal thin film such as aluminum, or the like. For example, the thickness of the straightening layer 4 is approximately 10 nm to 1,000 nm.

The mirror device 1 further includes a first coil 221 and a second coil 231. For example, the first coil 221 is embedded in the first movable portion 22 and extends in a spiral shape at an outer edge portion of the first movable portion 22 when viewed in the Z axis direction. For example, the second coil 231 is embedded in the second movable portion 23 and extends in a spiral shape at an outer edge portion of the second movable portion 23 when viewed in the Z axis direction. For example, the first coil 221 and the second coil 231 are constituted using a metal material such as copper. In FIG. 3, illustration of the first coil 221 and the second coil 231 is omitted.

In the mirror device 1 constituted as above, the first movable portion 22 provided with the mirror layer 3 swings around the first axis X1 and the second axis X2 orthogonal to each other. Specifically, when a drive signal for linear operation is input to the second coil 231 via an electrode pad 5 and a wiring provided in the structure 2, a Lorentz force acts on the second coil 231 due to an interaction with respect to a magnetic field generated by the magnetic field generation portion 70. The mirror layer 3 (first movable portion 22) can be subjected to linear operation together with the second movable portion 23 around the second axis X2 by utilizing the balance between the Lorentz force and an elastic force of each of the second coupling portions 25.

Meanwhile, when a drive signal for resonance operation is input to the first coil 221 via the electrode pad 5 and the wiring, a Lorentz force acts on the first coil 221 due to an interaction with respect to a magnetic field generated by the magnetic field generation portion 70. The mirror layer 3 (first movable portion 22) can be subjected to resonance operation around the first axis X1 by utilizing resonance of the first movable portion 22 in a resonance frequency in addition to the Lorentz force.

Here, the electrode pad 5 is provided in the base portion 21 as an example. More specifically, the electrode pad 5 is provided in a region corresponding to the base portion 21 on the first front surface 2a of the structure 2. The structure 2 includes the base portion 21, the first movable portion 22, the second movable portion 23, the pair of first coupling portions 24, and the pair of second coupling portions 25. In addition, the structure 2 and the mirror layer 3 provided in the first movable portion 22 constitute a different structure 7. The structure 7 may further include the electrode pad 5 and the straightening layer 4.

Figure 4:
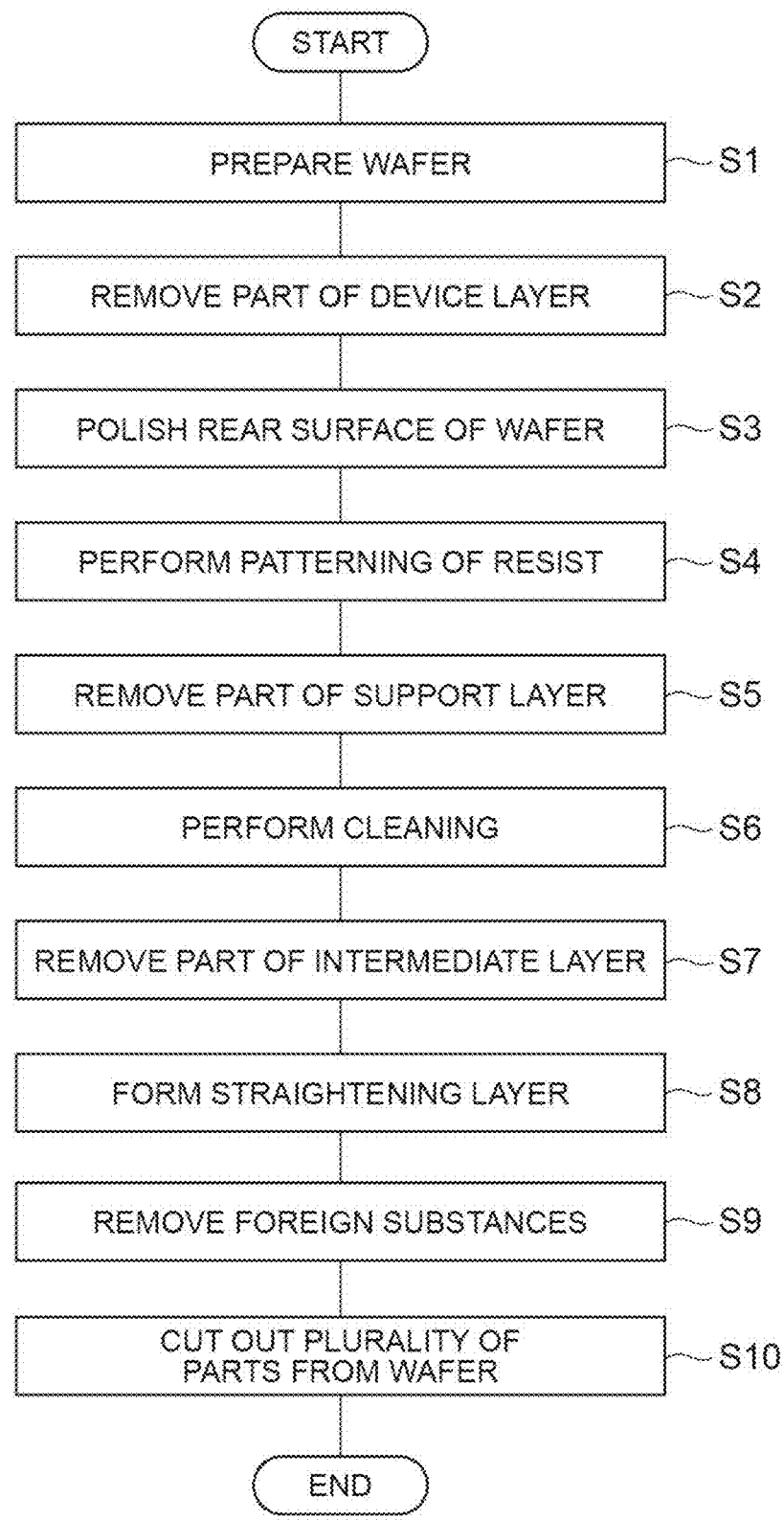
FIG. 4 is a flowchart of a mirror device manufacturing method illustrated in FIG. 2.
Figure 5:
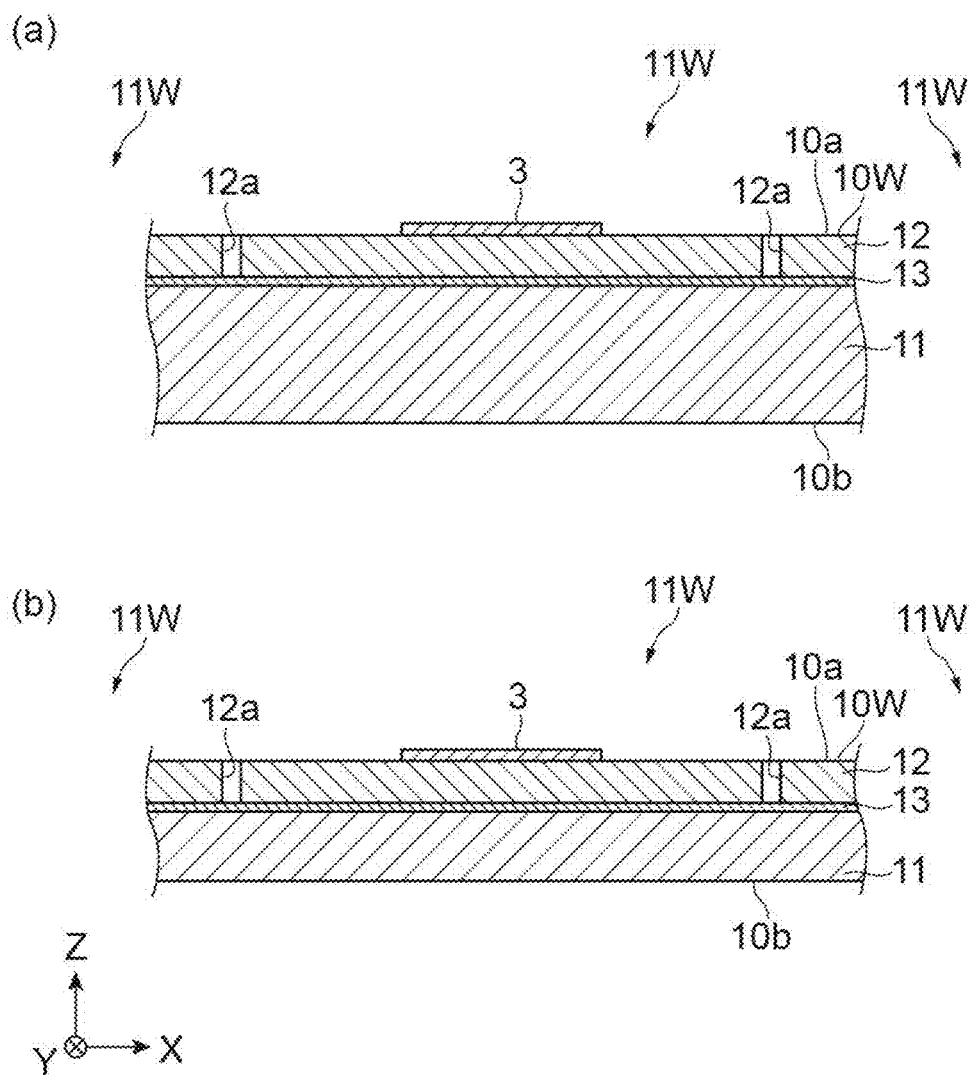
FIG. 5 is a cross-sectional view for describing the mirror device manufacturing method illustrated in FIG. 2.
Figure 7:
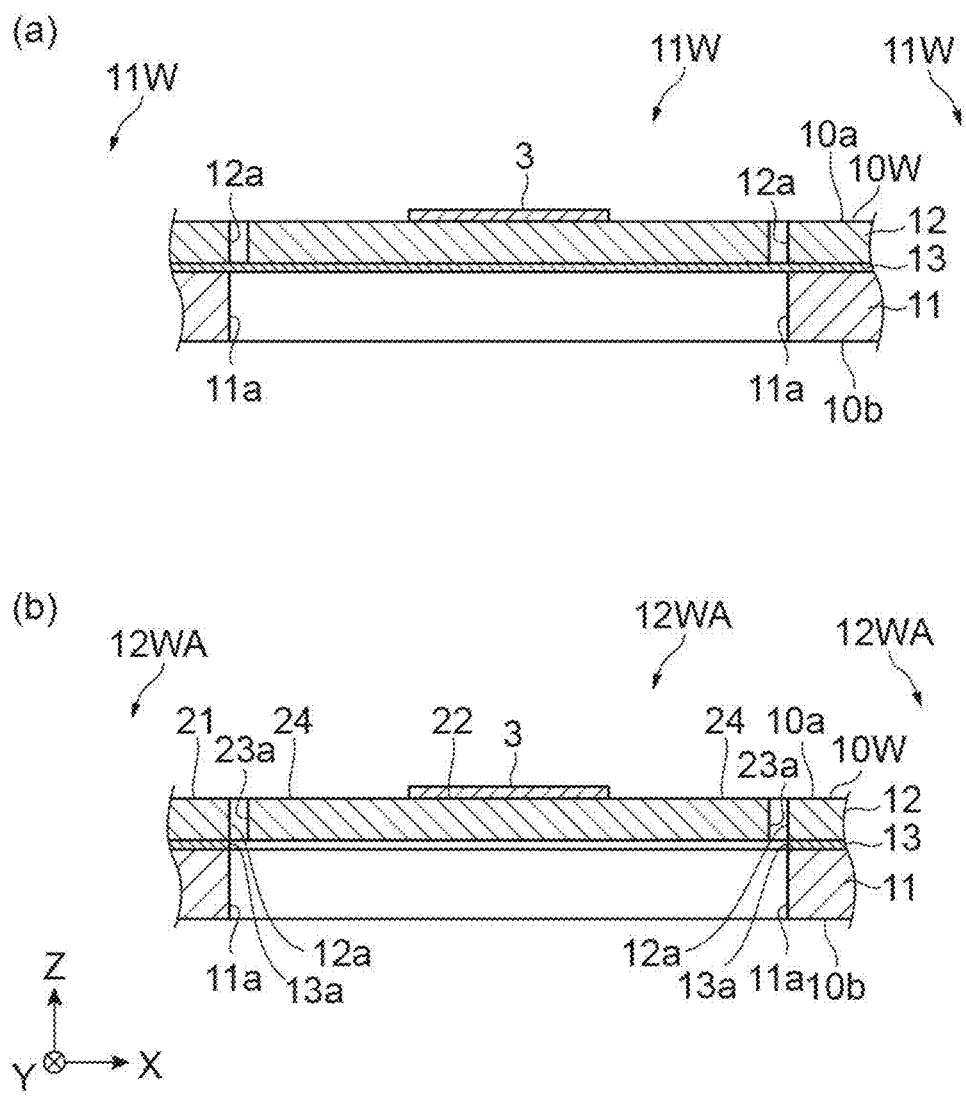
FIG. 7 is a cross-sectional view for describing the mirror device manufacturing method illustrated in FIG. 2.

Next, a method for manufacturing the mirror device 1 will be described. First, as illustrated in FIGS. 4 and 5(a), a wafer 10W having the support layer 11, the device layer 12, and the intermediate layer 13 is prepared (Step S1). The wafer 10W has a front surface 10a and a rear surface 10b on a side opposite to the front surface 10a. The front surface 10a is a surface serving as the first front surface 2a of the structure 2. The wafer 10W includes a plurality of parts 11W each serving as the structure 2 (that is, the structure 7). The part 11W is a part of the wafer 10W before the structure 2 is formed. Each step of the method for manufacturing the mirror device 1 is performed at a level of a wafer. In FIGS. 5 to 8, one part 11W of the wafer 10W is illustrated. Hereinafter, description will be given focusing on one part 11W of the wafer 10W.

Subsequently, processing of the wafer 10W prepared in Step S1 is performed. Regarding an overview of the subsequent step, when a part of each of the support layer 11, the device layer 12, and the intermediate layer 13 is removed from the wafer 10W through etching, a plurality of parts 12WA (refer to FIG. 8(b)) each corresponding to the structure 2 are formed in the wafer 10W. The part 12WA is a part of the wafer 10W in which the structure 2 is formed. As described below, the mirror layer 3, the electrode pad 5, and the straightening layer 4 are formed in the part 12WA. Therefore, hereinafter, a part including the part 12WA, the mirror layer 3, the electrode pad 5, and the straightening layer 4 may be referred to as a part 17WA corresponding to the structure 7.

The subsequent step will be described in more detail. In the method for manufacturing the mirror device 1, subsequent to Step S1, first, a part of the device layer 12 is removed from the wafer 10W through etching (Step S2). Specifically, parts corresponding to the first slit 22a and the second slit 23a in the device layer 12 are removed. As a result, the end surface 12a of the device layer 12 is formed. In Step S2, the electrode pad 5, the wiring, and the like for inputting a drive signal to the first coil 221, the second coil 231, the first coil 221, and the second coil 231 are provided in the device layer 12. In Step S2, the mirror layer 3 is formed at a part corresponding to the first movable portion 22 on the front surface 10a of the wafer 10W. For example, the mirror layer 3 is formed through vapor deposition of a metal. In Step S2, a resist used for removing the device layer 12 is removed from the wafer 10W by cleaning for removing a resist.

Subsequently, as illustrated in FIG. 5(b), the rear surface 10b of the wafer 10W is polished (Step S3). The wafer 10W is thinned by polishing of the rear surface 10b. The polished rear surface 10b of the wafer 10W is a surface serving as a part of the second front surface 2b of the structure 2.

Subsequently, as illustrated in FIG. 6(a), a resist 19 is patterned on the rear surface 10b of the wafer 10W (Step S4). Specifically, the resist 19 is provided in a region corresponding to the base portion 21 on the rear surface 10b. Subsequently, as illustrated in FIG. 6(b), a part of the support layer 11 is removed from the wafer 10W through etching via the resist 19 (Step S5). Specifically, a part on a side inward from a part corresponding to the base portion 21 in the support layer 11 is removed. As a result, the end surface 11a of the support layer 11 is formed. For example, a part of the support layer 11 is removed through reactive ion etching (DRIE) using a Bosch process. In Step S5, when a part of the support layer 11 is removed from the wafer 10W, a polymer or the like is used as a protective film, for example.

Subsequently, cleaning is performed (Step S6). First, here, cleaning for removing (peeling) the resist 19 from the rear surface 10b of the wafer 10W is performed. Accordingly, as illustrated in FIG. 7(a), the resist 19 is removed from the wafer 10W. Subsequently, cleaning for removing a polymer or the like used as a protective film in Step S5 from the wafer 10W is performed.

Subsequently, as illustrated in FIG. 7(b), a part of the intermediate layer 13 is removed from the wafer 10W through etching (Step S7). Specifically, a part on a side inward from a part corresponding to the base portion 21 in the intermediate layer 13 is removed. As a result, the first slit 22a and the second slit 23a are formed. At this time, the end surface 13a of the intermediate layer 13 is formed. In Step S7, the plurality of parts 12WA each corresponding to the structure 2 are formed in the wafer 10W by forming the first slit 22a and the second slit 23a is formed, and the plurality of parts 12WA are completed. Namely, a plurality of first movable portions 22 and a plurality of second movable portions 23 are released. In Step S7, a part of the intermediate layer 13 is removed from the wafer 10W through dry through etching.

Subsequently, as illustrated in FIG. 8(a), the straightening layer 4 is formed on a surface on a side opposite to a surface on which the mirror layer 3 is formed (front surface 10a) on the front surface of the wafer 10W (a surface on a side opposite to the mirror layer 3 in each of the support layer 11 and the device layer 12) (Step S8). As described above, the mirror layer 3 and the electrode pad 5 have already been formed in the part 12WA. Thus, the part 17WA including the part 12WA, the mirror layer 3, the electrode pad 5, and the straightening layer 4 is formed by forming the straightening layer 4 in this Step S8. Thereafter, as illustrated in FIG. 8(b), the wafer 10W is cut such that each of the plurality of parts 12WA (that is, a plurality of parts 17WA each corresponding to the structure 7) is cut out from the wafer 10W (Step S10). Accordingly, a plurality of mirror devices 1 are manufactured.

Through the foregoing Steps S2 to S8, with respect to the wafer 10W, the structure 7 including the structure 2 and the mirror layer 3 (as well as the electrode pad 5 and the straightening layer 4) provided in the structure 2 is formed. That is, Steps S2 to S8 correspond to a forming step of forming the structure 7 by forming the base portion 21, the first movable portion 22, the second movable portion 23, the pair of first coupling portions 24, and the pair of second coupling portions 25 through processing of the wafer 10W, and forming the mirror layer 3 (as well as the electrode pad 5 and the straightening layer 4) in the first movable portion 22. The forming step may not include Step S8. In such a case, the structure 7 does not have the straightening layer 4. In addition, the foregoing example is an example in which the mirror layer 3 is consequently formed in the first movable portion 22 by forming (releasing) the first movable portion 22 and the like through processing of the wafer 10W after the mirror layer 3 is formed at a part corresponding to the first movable portion 22 on the front surface 10a of the wafer 10W. In contrast, the mirror layer 3 may be formed with respect to the first movable portion 22 after the first movable portion 22 and the like are formed (after released) through processing of the wafer 10W without forming the mirror layer 3 at a part corresponding to the first movable portion 22 on the front surface 10a of the wafer 10W. Both the cases are included in the forming step of forming the structure 7 by forming the base portion 21, the first movable portion 22, the second movable portion 23, the pair of first coupling portions 24, and the pair of second coupling portions 25 through processing of the wafer 10W, and forming the mirror layer 3 in the first movable portion 22.

Here, in this method for manufacturing the mirror device 1, a step of removing foreign substances on the mirror layer 3 (Step S9) is performed between Steps S8 and S10. Subsequently, this Step S9 will be described in detail.

FIG. 9 is a flowchart of a step of removing foreign substances shown in FIG. 4. Here, the following step of removing foreign substances (Step S9) is performed with respect to the first front surface 2a side (that is, the front surface 10a side of the wafer 10W, and the mirror layer 3 side) in the structure 7 (part 17WA). However, the step of removing foreign substances may be performed with respect to the second front surface 2b side (that is, the rear surface 10b side of the wafer 10W) in the structure 7. Alternatively, the step of removing foreign substances can also be performed with respect to both the first front surface 2a side and the second front surface 2b side.

FIG. 9(a) shows a first example of the step of removing foreign substances. As illustrated in FIG. 9(a), in this first example, first, appearance inspection of the structure 7 (part 17WA) is performed (Step S101, a first inspecting step). Accordingly, the presence or absence of foreign substances on the structure 7 and a region where foreign substances are present in the structure 7 are identified. Further, as a result of Step S101, when foreign substances are found on the structure 7, the foreign substances are scraped off (Step S102, a first scraping step). However, this Step S102 may be omitted.

Subsequently, collection of foreign substances (picking-up of foreign substances) of the structure 7 is performed using a collection member (Step S103, a collecting step). In this Step S103, as a result of Step S101, when foreign substances are found on the structure 7, the collection of foreign substances is performed with respect to the region where foreign substances are present in the structure 7. Regarding a method for collecting foreign substances, causing foreign substances to be adhered to the collection member due to an electrostatic force, and causing foreign substances to be adhered to the collection member due to an adhesive force are conceivable. Moreover, foreign substances may be suctioned using a suction nozzle or the like. Namely, the aforementioned collection of foreign substances includes a case of collecting particular foreign substances (for example, a case of using an electrostatic force or a suction force) without bringing the collection member into contact with foreign substances, and a case of collecting particular foreign substances (for example, a case of using an adhesive force) by bringing the collection member into contact with foreign substances.

In this first example, a collection member 90 as illustrated in FIG. 10 can be used. FIG. 10(a) is a side view illustrating the entire collection member, and FIG. 10(b) is a perspective view illustrating a distal end portion of the collection member. The collection member 90 illustrated in FIG. 10 has a handling portion 91 and an adhesion portion 92 provided at a distal end of the handling portion 91. The handling portion 91 exhibits an elongated rod shape as an example. It may be used as a grip for a worker or may be used for assembling with respect to the device, for example.

For example, the adhesion portion 92 is constituted of a film (alternatively, a tape or a feather) having an electrostatic force or a film (or a tape) having an adhesive force. The adhesion portion 92 is formed to have a tapered shape tapered in a direction toward a distal end 92a from a base end 92b connected to the handling portion 91. More specifically, widths D1 of a pair of surfaces of the adhesion portion 92 are constant from the base end 92b to the distal end 92a, and widths D2 of another pair of surfaces of the adhesion portion 92 are reduced from the base end 92b toward the distal end 92a. For example, a length D3 of the adhesion portion 92 indicating a distance from the base end 92b to the distal end 92a of the adhesion portion 92 is several times (for example, approximately five times) the widths D1 and D2 of the adhesion portion 92 in the base end 92b. The widths D1 and the widths D2 of the adhesion portion 92 in the base end 92b are the same as an example. A rigidity of the adhesion portion 92 is lower than rigidities of the first movable portion 22 and the second movable portion 23.

In Step S103, the collection member 90 described above is brought into contact with only foreign substances without bringing the collection member 90 into direct contact with the structure 7. In other words, in Step S103, the collection member 90 is brought into contact with the structure 7 via foreign substances. In Step S103, when it is brought into contact with the first movable portion 22 or the second movable portion 23 (via foreign substances), from a viewpoint of avoiding breakage of the first movable portion 22 and the second movable portion 23, the collection of foreign substances is performed by bringing the collection member 90 into contact with the first movable portion 22 or the second movable portion 23 such that the first movable portion 22 and the second movable portion 23 are not bent. A case of bringing the collection member 90 into contact with the first movable portion 22 includes a case of being brought into contact therewith via foreign substances and the mirror layer 3 (when foreign substances are present on the mirror layer 3), in addition to a case of being brought into contact therewith via only foreign substances as described above (when foreign substances are present at a part other than the part where the mirror layer 3 of the first movable portion 22 is provided). In addition, in this Step S103, the collection member 90 can be brought into contact with the first movable portion 22 such that breakage of the first coupling portions 24 for coupling the first movable portion 22 to the base portion 21 (via the second movable portion 23 and the second coupling portions 25) is avoided. This point will be more specifically described.

Figure 11:
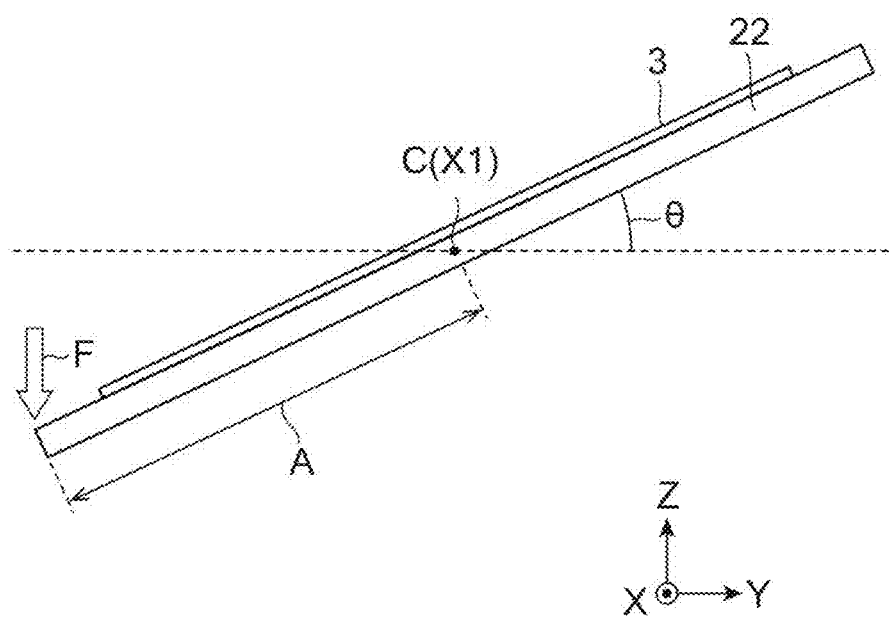
FIG. 11 is a schematic side view of a first movable portion when viewed in an X axis direction.

As described above, the first coupling portions 24 couples the first movable portion 22 to the base portion 21 (via the second movable portion 23 and the second coupling portions 25) such that the first movable portion 22 can swing around the first axis X1 along the X axis direction. In other words, the first movable portion 22 can swing about a swinging axis (first axis X1) that is an axis passing through the first coupling portions 24. FIG. 11 is a schematic side view of the first movable portion 22 when viewed in the X axis direction.

As illustrated in FIG. 11, the first axis X1 passes through a center C of the first movable portion 22 in the Y axis direction. When a spring constant of the first coupling portions 24 is a swinging direction is a spring constant ko, a torque T required when the first movable portion 22 swings around the first axis X1 at a largest angle θ is expressed by Spring constant $k_θ$×Largest angle θ. As an example, when the spring constant $k_θ$ is $5.7×10^{-6}$[Nm/rad] and the largest angle θ is 9°, Torque $T=8.98×10^{-7}≈1×10^{-6}$ [Nm] is established.

When the collection member 90 is brought into contact with a point at a distance A farthest from the center C of the first movable portion 22, the largest torque is applied to the first coupling portions 24. The torque at this time becomes the torque T applying the foregoing largest angle θ when a force F from the collection member 90 to the first movable portion 22 becomes Torque T/Distance A. For example, when the distance A is $1.575×10^{-3}$ [m], this force F becomes $8.98×10^{-7}/1.575×10^{-3}=5.7×10^{-4}≈6×10^{-4}$[N]. In order to curb breakage of the first coupling portions 24, a force applied from the collection member 90 to the first movable portion 22 may become equal to or smaller than this force F.

That is, in Step S103, the collection of foreign substances is performed by bringing the collection member 90 into contact with the first movable portion 22 such that a torque generated in the first coupling portions 24 in accordance with a force applied from the collection member 90 to the first movable portion 22 becomes equal to or smaller than the torque T causing a swinging angle of the first movable portion 22 to be the largest angle θ. However, in order to reliably curb breakage thereof even when the collection of foreign substances is performed by bringing the collection member 90 into contact with the first movable portion 22 a plurality of times, it is preferable that the collection of foreign substances be performed in Step S103 by bringing the collection member 90 into contact with the first movable portion 22 such that a torque generated in the first coupling portions 24 in accordance with a force applied from the collection member 90 to the first movable portion 22 becomes equal to or smaller than a torque causing the swinging angle of the first movable portion 22 to be an angle which is ½ the largest angle θ. Each of the foregoing values is merely an example and may vary within a range of approximately 100 times, for example, depending on setting of the spring constant of the first coupling portions 24.

Meanwhile, FIG. 9(b) is a flowchart showing a second example of the step of removing foreign substances. In this second example as well, the collection of foreign substances from the structure 7 is performed using the collection member (Step S103, the collecting step). However, in this example, the collection of foreign substances is performed by bringing the collection member into contact with the entire surface of the structure 7. In this case, the collection of foreign substances may be performed by bringing the collection member collectively covering the entire surface of the structure 7 into contact with the structure 7, or the collection of foreign substances may be performed by bringing the collection member corresponding to a part of the structure 7 into contact with the entire surface of the structure 7 a plurality of times. The collection member in this case can also have a rigidity lower than the rigidities of the first movable portion 22 and the second movable portion 23.

In this second example, Step S101 for the appearance inspection can be omitted. That is, in this second example, the collection of foreign substances can be performed regardless of the presence or absence of foreign substances on the structure 7. However, in this second example as well, Step S101 may be performed. When Step S101 is performed in the second example, only the presence or absence of foreign substances on the structure 7 may be identified, and there is no need to identify a region where foreign substances are present in the structure 7 (or it may be identified). In addition, in this second example as well, Step S102 of scraping off foreign substances may be performed.

As above, in the method for manufacturing the mirror device 1, after Step S9 of removing foreign substances is performed, Step S10 of cutting the wafer 10W such that each of the plurality of parts 12WA (that is, the plurality of parts 17WA) is cut out from the wafer 10W is performed. The order of Steps S9 and S10 may be reversed. That is, before the collection of foreign substances is performed in Step S9, the wafer 10W may be cut in Step S10 such that each of the plurality of parts 12WA (that is, the plurality of parts 17WA) is cut out from the wafer 10W.

Figure 12:
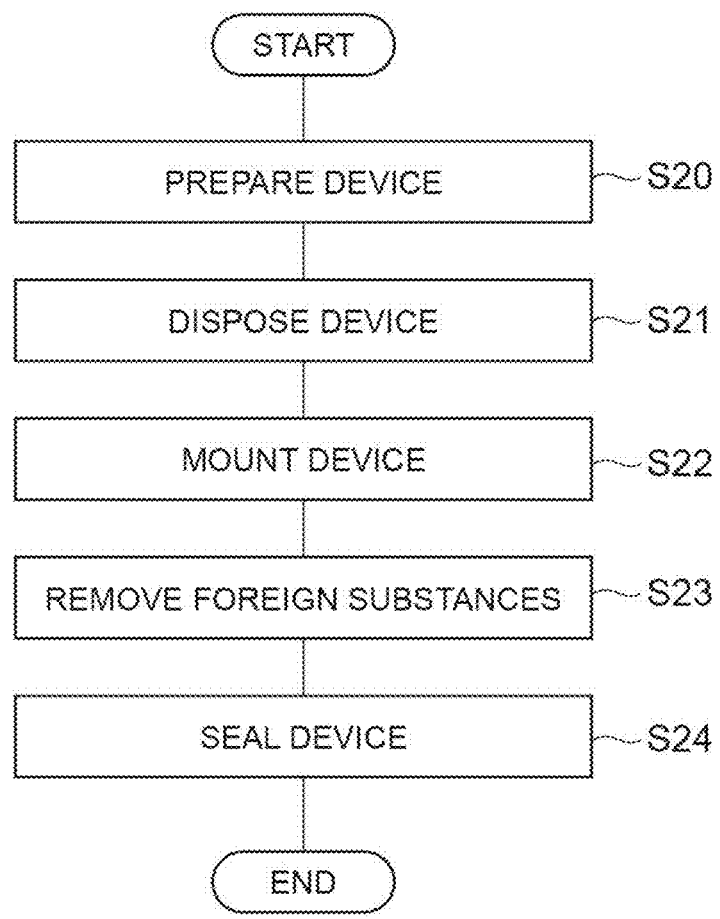
FIG. 12 is a flowchart showing a method of manufacturing the mirror unit illustrated in FIG. 1.

Subsequently, a method for manufacturing the mirror unit 100 will be described. FIG. 12 is a flowchart showing a method for manufacturing the mirror unit illustrated in FIG. 1. As illustrated in FIG. 12, in this manufacturing method, first, the mirror device 1 is prepared (Step S20, a preparing step). When the mirror device 1 is manufactured, the method for manufacturing the mirror device 1 described above can be performed.

Subsequently, the mirror device 1 is disposed on a mounting substrate (mounting portion) 41 and is fixed thereto (Step S21, a fixing step). For example, the mirror device 1 can be fixed to the mounting substrate 41 using an adhesive, fitting, screwing, or the like. Subsequently, the wire W is provided between the mirror device 1 and the mounting substrate 41 so that the mirror device 1 is electrically connected to the mounting substrate 41 and the mirror device 1 is mounted on the mounting substrate 41 (Step S22). Subsequently, the collection of foreign substances from the structure 7 is performed using the collection member (Step S23, the collecting step). This Step S23 can be performed in a manner similar to that of Step S9 of the method for manufacturing the mirror device 1 described above. The sequence of Steps S22 and S23 may be reversed. Subsequently, for example, the window member 43 is joined to the frame member 42 so that the mirror device 1 is sealed by the package 40 (Step S24, a sealing step). As seen above, the mirror unit 100 is manufactured.

As described above, in the method for manufacturing the mirror device 1, first, the structure 7 is formed by forming the swingable first movable portion 22 and forming the mirror layer 3 in the first movable portion 22. Further, the collection of foreign substances from the structure 7 is performed using the collection member 90. For this reason, when foreign substances are adhered to the structure 7, the foreign substances are removed. Particularly, in this manufacturing method, since foreign substances of the structure 7 are collected, scattered foreign substances do not affect operation of the first movable portion 22 and the like. That is, according to this manufacturing method, influence on operation of the first movable portion 22 and the like is curbed, and foreign substances can be removed. Particularly, if foreign substances of the mirror layer 3 of the structure 7 are removed, reduction in reflectance caused by foreign substances is curbed.

In addition, in the method for manufacturing the mirror device 1, in the collecting step (Step S103 (the same applies hereinafter)), the collection of foreign substances may be performed by bringing the collection member 90 into contact with only foreign substances. In this case, the collection member 90 does not directly come into contact with the structure 7. Therefore, damage to a surface of the structure 7 is avoided.

In addition, the method for manufacturing the mirror device 1 may further include the first inspecting step (Step S101 (the same applies hereinafter)) of performing appearance inspection of the structure 7 before the collecting step. In this case, foreign substances on the structure 7 can be found and reliably collected through the appearance inspection.

In addition, in the method for manufacturing the mirror device 1, in the collecting step, the collection of foreign substances may be performed with respect to a region where foreign substances are present in the structure 7 when foreign substances are found on the structure 7 as a result of the first inspecting step. In this case, foreign substances found through the appearance inspection can be more reliably collected.

In addition, the method for manufacturing the mirror device 1 may further include a scraping step (Step S102 (the same applies hereinafter)) of scraping off foreign substances after the first inspecting step or before the collecting step when foreign substances are found on the structure 7 as a result of the first inspecting step. In this case, even when foreign substances are firmly adhered to the structure 7, the foreign substances can be reliably collected.

In addition, in the method for manufacturing the mirror device 1, in the collecting step, the collection of foreign substances may be performed by bringing the collection member 90 into contact with the entire surface of the structure 7. In this case, since there is no need to identify positions of foreign substances adhered to the structure 7, the appearance inspection can be omitted.

In addition, in the method for manufacturing the mirror device 1, in the collecting step, the collection of foreign substances may be performed using the collection member 90 (adhesion portion 92) having a rigidity lower than the rigidities of the first movable portion 22 and the second movable portion 23. In this case, the collection member 90 (adhesion portion 92) is preferentially bent with respect to the first movable portion 22 and the second movable portion 23. Therefore, bending of the first movable portion 22 and the second movable portion 23 can be curbed.

In addition, in the method for manufacturing the mirror device 1, in the collecting step, the collection of foreign substances can be performed by bringing the collection member 90 into contact with the first movable portion 22 or the second movable portion 23 such that the first movable portion 22 and the second movable portion 23 are not bent. In this case, breakage of the first movable portion 22 and the second movable portion 23 can be curbed.

In addition, in the method for manufacturing the mirror device 1, the first movable portion 22 can swing about the swinging axis that is the first axis X1 passing through the first coupling portions 24. Further, in the collecting step, the collection of foreign substances can be performed by bringing the collection member 90 into contact with the mirror layer 3 such that a torque generated in the first coupling portions 24 in accordance with a force applied from the collection member 90 to the first movable portion 22 becomes equal to or smaller than the torque T causing the swinging angle of the first movable portion 22 to be the largest angle θ. For this reason, breakage of the first coupling portions 24 providing the swinging axis of the first movable portion 22 can be curbed.

In addition, the method for manufacturing the mirror device 1 includes a cutting step (Step S11 (the same applies hereinafter)) of cutting the wafer 10W. Further, in the forming step, a plurality of parts 17WA each corresponding to the structure 7 are formed in the wafer 10W. In the cutting step, the wafer 10W is cut such that each of the plurality of parts 17WA is cut out from the wafer 10W after the collecting step. Accordingly, a plurality of mirror devices 1 can be manufactured. Particularly, since the collection of foreign substances is performed before the wafer 10W is cut, influence on operation of the first movable portion 22 and the second movable portion 23 due to movement of foreign substances on the structure 7 when the wafer 10W is cut is avoided. In addition, before the cutting step, the parts 17WA corresponding to a plurality of structures 7 adjacent to each other are integrated. Therefore, the wafer 10W is in a high strength state. For this reason, breakage is unlikely to occur in the structure 7 during the collecting step.

Moreover, the method for manufacturing the mirror device 1 includes a cutting step of cutting the wafer 10W. Further, in the forming step, a plurality of parts 17WA corresponding to the structures 7 may be formed in the wafer 10W. In the cutting step, the wafer 10W may be cut such that each of the plurality of parts 17WA is cut out from the wafer 10W after the forming step and before the collecting step.

Accordingly, a plurality of mirror devices 1 can be manufactured. Particularly, since the collection of foreign substances is performed after the wafer 10W is cut, foreign substances which have been generated and adhered when the wafer 10W is cut can be removed.

Here, in the method for manufacturing the mirror unit 100, the mirror device 1 having the structure 7 including the swingable first movable portion 22 provided with the mirror layer 3 is prepared. Further, after the mirror device 1 is mounted, the collection of foreign substances from the structure 7 is performed using the collection member 90. For this reason, when foreign substances are adhered to the structure 7, the foreign substances are removed. Particularly, in this manufacturing method, since foreign substances of the structure 7 are collected, scattered foreign substances do not affect operation of the first movable portion 22 and the like. That is, according to this manufacturing method, influence on operation of the first movable portion 22 and the like is curbed, and foreign substances can be removed. In addition, in the method for manufacturing the mirror unit 100, the collection of foreign substances is performed after the mirror device 1 is fixed to the mounting substrate 41. Namely, in this manufacturing method, the collection of foreign substances is performed in a latter step. Therefore, a risk that foreign substances are adhered again in a step after the collection of foreign substances is performed becomes small.

Moreover, the method for manufacturing the mirror unit 100 includes the sealing step (Step S24) of sealing the mirror device 1 after the collecting step (Step S23). In this manner, since the collection of foreign substances is performed before the mirror device 1 is sealed, a yield rate is improved.

The foregoing embodiment describes a form of the present disclosure. Therefore, the present disclosure is not limited to the form described above and may be subjected to arbitrary change.

For example, the mirror device 1 may be constituted as a single-axis mirror device in which the second movable portion 23 is omitted. In addition, a method for driving the mirror device 1 may be a piezoelectric drive type or an electrostatic drive type.

In addition, in the foregoing embodiment, a case in which the plurality of parts 17WA corresponding to the structures 7 are formed with respect to the wafer 10W and each of the parts 17WA is cut out from the wafer 10W has been described as an example. However, a single structure 7 may be formed in the wafer 10W.

In addition, in the foregoing method for manufacturing the mirror device 1, as the second example of the step of removing foreign substances (Step S9 (the same applies hereinafter)), an example in which the collection of foreign substances is performed by bringing the collection member into contact with the entire surface of the structure 7 during the collecting step has been described. However, as another example of the step of removing foreign substances, the collection of foreign substances may be performed by bringing the collection member into contact with a part of the structure 7 during the collecting step. In this case, a part of the structure 7 indicates a wide range compared to a part corresponding to one foreign substance and indicates a part of a range not extending to the entire surface. In this case, areas in the structure 7 with which the collection member 90 comes into contact are limited. Therefore, a range in the structure 7 having a possibility of damage can be limited. In this case as well, the appearance inspection can be omitted by setting parts with which the collection member 90 is brought into contact in advance.

In addition, the foregoing method for manufacturing the mirror device 1 may further include a second inspecting step of performing the appearance inspection of the structure 7 after the collecting step, and a second scraping step of scraping off foreign substances when foreign substances remain in the structure 7 as a result of the second inspecting step in the step of removing foreign substances. In this case, the collecting step can be performed again after the second scraping step. In this case, foreign substances can be reliably collected. In this case as well, the second scraping step may be omitted.

In addition, in the foregoing method for manufacturing the mirror device 1, the first scraping step of scraping off foreign substances is performed after the first inspecting step and before the collecting step. However, the first scraping step may be performed at the same time as the collecting step (that is, foreign substances may be collected while being scraped off). That is, the first scraping step may be performed after the first inspecting step, and before the collecting step, or during the collecting step.

In addition, in the foregoing method for manufacturing the mirror device 1, the first inspecting step of performing the appearance inspection of the structure 7 is performed after the forming step and before the collecting step. However, the first inspecting step may be performed at the same time as the collecting step (that is, foreign substances may be collected while the appearance inspection is performed). That is, the first inspecting step may be performed after the forming step, and before the collecting step, or during the collecting step. For example, a case in which the first inspecting step and the collecting step are performed at the same time corresponds to a case in which after inspection of the appearance of the structure 7 has started, the appearance inspection of another part in the structure 7 proceeds while a foreign substance found at one part in the structure 7 is collected, and the like.

Moreover, in the foregoing method for manufacturing the mirror device 1, an example in which the collection of foreign substances is performed while having the entire structure 7 as a target in the step of removing foreign substances has been described. In contrast, the collection of foreign substances may be performed while having each part of the structure 7, such as the mirror layer 3, the base portion 21, or the electrode pad 5, as a target in the step of removing foreign substances. If the collection of foreign substances from the mirror layer 3 is performed while having the mirror layer 3 as a target in the step of removing foreign substances, reduction in reflectance of the mirror layer 3 caused by foreign substances adhered to the mirror layer 3 can be curbed.

In addition, if the collection of foreign substances from the electrode pad 5 is performed while having the electrode pad 5 as a target in the step of removing foreign substances, poor connection between the wiring and the electrode pad 5 can be curbed. In this manner, when each part of the structure 7, such as the mirror layer 3, the base portion 21, or the electrode pad 5, becomes a target, each of the steps can be applied to the collection of foreign substances from each part by rewording the structure 7 to each part in description of each of the foregoing steps. Even when the collection of foreign substances is performed while having the entire structure 7 as a target, if foreign substances of the mirror layer 3 are removed, reduction in reflectance of the mirror layer 3 is curbed, and if foreign substances of the electrode pad 5 are removed, poor connection in the electrode pad 5 is curbed.

In addition, in the foregoing method for manufacturing the mirror unit 100, an example in which the mirror device 1 is fixed and mounted on the mounting substrate 41 has been described. However, the method is not limited to a case in which the mirror device 1 is fixed and mounted on the mounting substrate 41, and the mirror device 1 may be mounted or the like by being directly disposed and fixed to the magnetic field generation portion 70. That is, the magnetic field generation portion 70 and the like may also be a mounting portion where the mirror device 1 is mounted.

Moreover, in the foregoing method for manufacturing the mirror unit 100, after the mirror device 1 is prepared (after the preparing step) and before the mirror device 1 is mounted (before the mounting step), the step of removing foreign substances described above may be performed while having the second front surface 2b side (a side opposite to the mirror layer 3) of the structure 7 as a target.

INDUSTRIAL APPLICABILITY

According to the present disclosure, a mirror device manufacturing method and a mirror unit manufacturing method in which influence on operation of the movable portion is curbed and foreign substances can be removed are provided.

REFERENCE SIGNS LIST

1 Mirror device
3 Mirror layer
7 Structure
10W Wafer
21 Base portion
22 First movable portion
24 First coupling portion
90 Collection member
100 Mirror unit

The invention claimed is:

1. A mirror device manufacturing method comprising:
a forming step of forming a structure by forming a base portion, a movable portion, and a coupling portion coupling the base portion and the movable portion to each other such that the movable portion is able to swing with respect to the base portion through processing of a wafer, and forming a mirror layer in the movable portion; and
a collecting step of performing collection of foreign substances from the structure using a collection member after the forming step such that the foreign substances are collected by the collection member after the mirror layer becomes swingable,
wherein the collecting step is performed with respect to a mirror surface formed on the movable portion,
the collection member includes an adhesion portion constituted of a film or a tape having an adhesive force, and
wherein in the collecting step, the collection of foreign substances is performed by bringing the adhesion portion of the collection member into contact with only the foreign substances without the adhesion portion of the collection member coming into contact with the mirror surface.

2. The mirror device manufacturing method according to claim 1 further comprising:
a first inspecting step of performing appearance inspection of the structure after the forming step, and before the collecting step, or during the collecting step.

3. The mirror device manufacturing method according to claim 2,
wherein in the collecting step, the collection of foreign substances is performed with respect to a region where the foreign substances are present in the structure when the foreign substances are found on the structure as a result of the first inspecting step.

4. The mirror device manufacturing method according to claim 2 further comprising:
a first scraping step of scraping off the foreign substances after the first inspecting step, and before the collecting step, or during the collecting step when the foreign substances are found on the structure as a result of the first inspecting step.

5. The mirror device manufacturing method according to claim 1 further comprising:
a second inspecting step of performing appearance inspection of the structure after the collecting step; and
a second scraping step of scraping off the foreign substances when the foreign substances remain in the structure as a result of the second inspecting step,
wherein the collecting step is performed again after the second scraping step.

6. The mirror device manufacturing method according to claim 1,
wherein in the collecting step, the collection of foreign substances is performed using the collection member having a rigidity lower than a rigidity of the movable portion.

7. The mirror device manufacturing method according to claim 1 further comprising:
a cutting step of cutting the wafer,
wherein in the forming step, a plurality of parts each corresponding to the structure are formed in the wafer, and
wherein in the cutting step, the wafer is cut such that each of the plurality of parts is cut out from the wafer after the collecting step.

8. The mirror device manufacturing method according to claim 1 further comprising:
a cutting step of cutting the wafer,
wherein in the forming step, a plurality of parts each corresponding to the structure are formed in the wafer, and
wherein in the cutting step, the wafer is cut such that each of the plurality of parts is cut out from the wafer after the forming step and before the collecting step.

9. A mirror unit manufacturing method comprising:
a preparing step of preparing a mirror device having a structure including a base portion, a movable portion, a coupling portion coupling the base portion and the movable portion to each other such that the movable portion is able to swing with respect to the base portion, and a mirror layer provided in the movable portion;
a fixing step of fixing the mirror device to a mounting portion after the preparing step; and
a collecting step of performing collection of foreign substances from the structure using a collection member after the fixing step such that the foreign substances are collected by the collection member after the mirror layer becomes swingable,
wherein the collecting step is performed with respect to a mirror surface formed on the movable portion,
the collection member includes an adhesion portion constituted of a film or a tape having an adhesive force, and
wherein in the collecting step, the collection of foreign substances is performed by bringing the adhesion portion of the collection member into contact with only the foreign substances without the adhesion portion of the collection member coming into contact with the mirror surface.

10. The mirror unit manufacturing method according to claim 9 further comprising:
a sealing step of sealing the mirror device after the collecting step.

* * * * *